(12) United States Patent
Sugeta et al.

(10) Patent No.: US 8,142,980 B2
(45) Date of Patent: Mar. 27, 2012

(54) OVER-COATING AGENT FOR FORMING FINE PATTERNS AND A METHOD OF FORMING FINE PATTERNS USING SUCH AGENT

(75) Inventors: Yoshiki Sugeta, Kanagawa (JP); Fumitake Kaneko, Kanagawa (JP); Toshikazu Tachikawa, Kanagawa (JP); Naohisa Ueno, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 12/591,924

(22) Filed: Dec. 4, 2009

(65) Prior Publication Data

US 2010/0086694 A1      Apr. 8, 2010

Related U.S. Application Data

(63) Continuation of application No. 12/318,899, filed on Jan. 12, 2009, now abandoned, which is a continuation of application No. 11/790,212, filed on Apr. 24, 2007, now abandoned, which is a continuation of application No. 11/116,251, filed on Apr. 28, 2005, now abandoned.

(30) Foreign Application Priority Data

Apr. 30, 2004   (JP) .................. 2004-135458

(51) Int. Cl.
*G03F 7/00*      (2006.01)
*G03F 7/004*   (2006.01)
(52) U.S. Cl. ............... 430/270.1; 430/273.1; 430/311
(58) Field of Classification Search ............ 430/270.1, 430/273.1, 311
See application file for complete search history.

(56) References Cited

U.S. PATENT DOCUMENTS

| | | | |
|---|---|---|---|
| 3,895,949 A | 7/1975 | Akamatsu et al. | |
| 5,750,312 A | 5/1998 | Chandross et al. | |
| 2004/0067303 A1 | 4/2004 | Sugeta et al. | |
| 2006/0079628 A1 | 4/2006 | Sugeta et al. | |
| 2010/0139838 A1 | 6/2010 | Sugeta et al. | |

FOREIGN PATENT DOCUMENTS

| | | |
|---|---|---|
| JP | 1-307228 | 12/1989 |
| JP | 4/364021 | 12/1992 |
| JP | 5-166717 | 7/1993 |
| JP | 5-241348 | 9/1993 |
| JP | 7-45510 | 2/1995 |
| JP | 2001-281886 | 10/2001 |
| JP | 2002/184673 | 6/2002 |
| JP | 2003-84459 | 3/2003 |
| JP | 2003-84460 | 3/2003 |
| JP | 2003-107752 | 4/2003 |
| JP | 2003-142381 | 5/2003 |
| JP | 2003-195527 | 7/2003 |
| JP | 2003-202679 | 7/2003 |
| KR | 10-2044-0026104 | 3/2004 |
| WO | 03/040831 | 5/2003 |

OTHER PUBLICATIONS

International Search Report issued in International (PCT) Application No. .

*Primary Examiner* — Amanda C. Walke
(74) *Attorney, Agent, or Firm* — Wenderoth, Lind & Ponack, L.L.P.

(57) ABSTRACT

It is disclosed an over-coating agent for forming fine-line patterns which is applied to cover a substrate having thereon photoresist patterns and allowed to shrink under heat so that the spacing between adjacent photoresist patterns is lessened, further characterized by comprising a water-soluble polymer which contains at least methacrylic acid and/or methyl methacrylate as the constitutive monomer thereof. Also disclosed is a method of forming fine-line patterns using the over-coating agent. The advantages of the invention are that the exposure margin is large, that the dimension control of photoresist patterns can be reflected on the dimension controllability in forming fine-line patterns, that the dimension control and planning of forming fine trace patterns after treatment for thermal shrinkage can be attained with ease in the stage of photoresist patterning, that the original photoresist pattern profile can be kept as such and the top of the photoresist pattern is not rounded after thermal shrinkage, that the degree of thermal shrinkage of the over-coating agent is large and thus the agent is effective in forming fine-line patterns.

13 Claims, No Drawings

OVER-COATING AGENT FOR FORMING FINE PATTERNS AND A METHOD OF FORMING FINE PATTERNS USING SUCH AGENT

This is a continuation of Ser. No. 12/318,899, filed Jan. 12, 2009, now abandoned which is a continuation of Ser. No. 11/790,212, filed Apr. 24, 2007, now abandoned, which is a continuation of Ser. No. 11/116,251, filed Apr. 28, 2005, now abandoned.

BACKGROUND OF THE INVENTION

1. Field of the Invention

This invention relates to an over-coating agent for forming fine patterns in the field of photolithographic technology and a method of forming fine-line patterns using such agent. More particularly, the invention relates to an over-coating agent for forming or defining fine-line patterns, such as hole patterns and trench patterns, that can meet today's requirements for higher packing densities and smaller sizes of semiconductor devices.

2. Description of the Related Art

In the manufacture of electronic components such as semiconductor devices and liquid-crystal devices, there is employed the photolithographic technology which, in order to perform a treatment such as etching on the substrate, first forms a film (photoresist layer) over the substrate using a so-called radiation-sensitive photoresist which is sensitive to activating radiations, then performs exposure of the film by selective illumination with an activating radiation, performs development to dissolve away the photoresist layer selectively to form an image pattern (photoresist pattern), and forms a variety of patterns including contact providing patterns such as a hole pattern and a trench pattern using the photoresist pattern as a protective layer (mask pattern).

With the recent increase in the need for higher packing densities and smaller sizes of semiconductor devices, increasing efforts are being made to form sufficiently fine-line patterns and submicron-electronic fabrication capable of forming patterns with linewidths of no more than 0.20 μm is currently required. As for the activating light rays necessary in the formation of mask patterns, short-wavelength radiations such as KrF, ArF and $F_2$ excimer laser beams and electron beams are employed. Further, active R&D efforts are being made to find photoresist materials as mask pattern formers that have physical properties adapted to those short-wavelength radiations.

In addition to those approaches for realizing submicron-electronic fabrication which are based on photoresist materials, active R&D efforts are also being made on the basis of pattern forming method with a view to finding a technology that can provide higher resolutions than those possessed by photoresist materials.

For example, JP-5-166717A discloses a method of forming fine patterns which comprises the steps of defining patterns (=photoresist-uncovered patterns) in a pattern-forming resist on a substrate, then coating over entirely the substrate with a mixing generating resist that is to be mixed with said pattern-forming resist, baking the assembly to form a mixing layer on both sidewalls and the top of the pattern-forming resist, and removing the non-mixing portions of said mixing generating resist such that the feature size of the photoresist-uncovered pattern is reduced by an amount comparable to the dimension of said mixing layer. JP-5-241348 discloses a pattern forming method comprising the steps of depositing a resin, which becomes insoluble in the presence of an acid, on a substrate having formed thereon a resist pattern containing an acid generator, heat treating the assembly so that the acid is diffused from the resist pattern into said resin in-soluble in the presence of an acid to form a given thickness of insolubilized portion of the resist near the interface between the resin and the resist pattern, and developing the resist to remove the resin portion through which no acid has been diffused, thereby ensuring that the feature size of the pattern is reduced by an amount comparable to the dimension of said given thickness.

However, in these methods; it is difficult to control the thickness of layers to be formed on the sidewalls of resist patterns. In addition, the in-plane heat dependency of wafers is as great as ten-odd nanometers per degree Celsius, so it is extremely difficult to keep the in-plane uniformity of wafers by means of the heater employed in current fabrication of semiconductor devices and this leads to the problem of occurrence of significant variations in pattern dimensions.

Another approach known to be capable of reducing pattern dimensions is by fluidizing resist patterns through heat treatment and the like. For example, JP-1-307228A discloses a method comprising the steps of forming a resist pattern on a substrate and applying heat treatment to deform the cross-sectional shape of the resist pattern, thereby defining a fine pattern. In addition, JP-4-364021A discloses a method comprising the steps of forming a resist pattern and heating it to fluidize the resist pattern, thereby changing the dimensions of its resist pattern to form or define a fine-line pattern.

In these methods, the wafer's in-plane heat dependency is only a few nanometers per degree Celsius and is not very problematic. On the other hand, it is difficult to control the resist deformation and fluidizing on account of heat treatment, so it is not easy to provide a uniform resist pattern in a wafer's plane.

An evolved version of those methods is disclosed in JP-7-45510A and it comprises the steps of forming a resist pattern on a substrate, forming a stopper resin on the substrate to prevent excessive thermal fluidizing of the resist pattern, then applying heat treatment to fluidize the resist so as to change the dimensions of its pattern, and thereafter removing the stopper resin to form or define a fine-line pattern. As the stopper, resin, a water-soluble resin, specifically, polyvinyl alcohol is employed singly. However, polyvinyl alcohol alone is not highly soluble in water and cannot be readily removed completely by washing with water, introducing difficulty in forming a pattern of good profile. The pattern formed is not completely satisfactory in terms of stability over time. In addition, polyvinyl alcohol cannot be applied efficiently by coating. Because of these and other problems, the method disclosed in JP-7-45510 has yet to be adopted commercially.

For solving these prior-art problems, the present applicant has proposed a technique directed to an over-coating agent for forming fine patterns and to a method of forming fine patterns in JP 2003-084459A, JP 2003-084460A, JP 2003-107752A, JP 2003-142381A, JP 2003-195527A, and JP 2003-202679A, etc. The technique shown in these patent publications has made it possible to form fine-line patterns that satisfy pattern dimension controllability, good profile and other necessary properties for semiconductor devices.

In the technique of forming fine-line patterns using the above over-coating agent for forming fine patterns, a photoresist layer is first formed on a substrate and this is exposed to light and developed to form a photoresist pattern (mask pattern). Next, the over-coating agent for forming fine patterns is applied to cover the entire surface of the substrate, and then this is heated, whereby the width of the photoresist pattern lines is enlarged by utilizing the thermal shrinking effect of the over-coating agent for forming fine patterns, and, as a result, the distance between the adjacent photoresist pattern lines is thereby narrowed and the width of the pattern line (of various patterns such as hole pattern, and trench pattern) to be determined by the distance between the photoresist pattern lines is also narrowed to give finer trace patterns.

The above-mentioned forming fine-line pattern process undergoes the influence of pattern dimension control in two stages: that is, a photoresist patterning stage (first stage) and a thermal shrinking stage of the over-coating agent for forming fine patterns (second stage). In the process comprising said two stages, when photoresist patterning is performed by increasing the luminous exposure of light to which a photoresist is exposed in the first stage, the degree of thermal shrinkage of the over-coating agent in the second stage is apt to be larger than the expected degree thereof and, as a result, it is often difficult to anticipate the dimension controllability in forming fine-line patterns in the process.

In that situation, it is desirable that the degree of thermal shrinkage of the over-coating agent could be kept constant even when the luminous exposure is varied relative to CD (critical dimension) of the photoresist pattern just after development.

In addition, it is also desirable that, even when various patterns differing in the pattern dimension and the line-to-line distance exist on one substrate, all the patterns could enjoy the same degree of thermal shrinkage.

In view of the shape of photoresist patterns, even when photoresist patterns having a good rectangular cross-sectional profile could be formed in the photoresist patterning stage (first stage), there may occur in the second stage a problematic phenomenon that the top of the photoresist pattern may be rounded owing to the thermal shrinkage of the over-coating agent applied thereto for forming fine patterns. In particular, when an ArF photoresist is used for forming finer line patterns, the top of the photoresist pattern could not keep the original rectangular profile thereof but is often rounded in the thermal shrinkage step for the over coating agent applied onto the photoresist pattern.

Accordingly, an over-coating agent for forming fine patterns has been studied and developed, which ensures a high degree of thermal shrinkage and a large exposure margin and enables pattern dimension control while keeping a good photoresist pattern profile as such.

JP 2001-281886A discloses a method comprising the steps of covering a surface of a resist pattern with an acidic film made of a resist pattern, size reducing material containing a water-soluble resin, rendering the surface layer of the resist pattern alkali-soluble, then removing said surface layer and the acidic film with an alkaline solution to reduce the feature size of the resist pattern. JP-2002-184673A discloses a method comprising the steps of forming a resist pattern on a substrate, then forming a film containing a water-soluble film forming component on said resist pattern, heat treating said resist pattern and film, and immersing the assembly in an aqueous solution of tetramethylammonium hydroxide, thereby forming a fine-line resist pattern without involving a dry etching step. However, both methods are simply directed to reducing the size of resist trace patterns themselves and therefore are totally different from the present invention in object.

SUMMARY OF THE INVENTION

The present invention has been accomplished in order to solve the aforementioned problems of the prior art and has as an object providing an over-coating agent for forming fine line patterns whose advantages are that, in forming fine line patterns utilizing the over-coating agent, the exposure margin is large, the photoresist pattern dimension control can be reflected on the fine-line pattern dimension control, the photoresist pattern profile is kept rectangular after a step of thermal shrinkage while its top is prevented from being rounded, and the degree of thermal shrinkage of the over-coating agent is large relative to the heating temperature at which the agent is heated.

Another object of the invention is to provide a method of forming fine trace patterns using the over-coating agent.

In order to attain the first object, the present invention provides an over-coating agent for forming fine patterns which is applied to cover a substrate having photoresist patterns thereon and allowed to shrink under heat so that the spacing between adjacent photoresist patterns is lessened, further characterized by comprising a water-soluble polymer which contains at least methacrylic acid and/or methyl methacrylate as the constitutive monomer thereof.

In order to attain the second object, the present invention provides a method of forming fine patterns comprising the steps of covering a substrate having thereon photoresist patterns with the above-described over-coating agent for forming fine patterns, then applying heat treatment to shrink the applied over-coating agent under the action of heat so that the spacing between adjacent photoresist patterns is lessened, and subsequently removing the applied film of the over-coating agent substantially completely.

In a preferred embodiment, the heat treatment is performed by heating the assembly at a temperature that does not cause thermal fluidizing of the photoresist patterns on the substrate.

DETAILED DESCRIPTION OF THE INVENTION

The over-coating agent of the invention for forming fine features of patterns is applied to cover a substrate, having photoresist patterns (mask patterns) thereon, including patterns typified by hole patterns or trench patterns, each of these patterns are defined by spacing between adjacent photoresist patterns (mask patterns). Upon heating, the applied film of over-coating agent shrinks to increase the width of each of the photoresist patterns, thereby narrowing or lessening adjacent hole patterns or trench patterns as defined by spacing between the photoresist patterns and, thereafter, the applied film is removed substantially completely to form or define fine patterns.

The phrase "removing the applied film substantially completely" as used herein means that after lessening the spacing between adjacent photoresist patterns by the heat shrinking action of the applied over-coating agent; said film is removed in such a way that no significant thickness of the over-coating agent will remain at the interface with the photoresist patterns. Therefore, the present invention does not include methods in which a certain thickness of the over-coating agent is left intact near the interface with the photoresist pattern so that the feature size of the pattern is reduced by an amount corresponding to the residual thickness of the over-coating agent.

The over-coating agent for forming fine patterns of the invention comprises a water-soluble polymer that contains at least methacrylic acid and/or methyl methacrylate as the constitutive monomer thereof.

Since the water-soluble polymer in the agent contains methacrylic acid and/or methyl methacrylate as the constitutive monomer thereof, it is possible to significantly improve the degree of thermal shrinkage of the over-coating agent to thereby reduce the line-to-line distance of the photoresist pattern during the thermal shrinkage of the agent under heat treatment while keeping the photoresist pattern profile as such.

For preferred embodiments of the over-coating agent of the invention, the water-soluble polymer is preferably any of the following embodiments (i) to (iv), to which, however, the invention should not be limited.

(i) The water-soluble polymer is a copolymer of methacrylic acid and/or methyl methacrylate with at least one monomer selected from those constituting alkylene glycol-based polymers, cellulosic derivatives, vinylic polymers, acrylic polymers, urea-based polymers, epoxy polymers, amide-based polymers and melamine-based polymers (in which the monomers to constitute acrylic polymers do not include methacrylic acid and methyl methacrylate).

The monomers to constitute alkylene glycol-based polymers include, for example, ethylene glycol and propylene glycol.

The monomers to constitute cellulosic derivatives include, for example, hydroxypropylmethyl cellulose phthalate, hydroxypropylmethyl cellulose acetate phthalate, hydroxypropylmethyl cellulose hexahydrophthalate, hydroxypropylmethyl cellulose acetate succinate, hydroxypropylmethyl cellulose, hydroxypropyl cellulose, hydroxyethyl cellulose, cellulose acetate hexahydrophthalate, carboxymethyl cellulose, ethyl cellulose and methyl cellulose.

The monomers to constitute vinylic polymers include, for example, N-vinylpyrrolidone, vinylimidazolidinone and vinyl acetate.

The monomers to constitute acrylic polymers (excluding methacrylic acid and methyl methacrylate) include, for example, acrylic acid, methyl acrylate, N,N-dimethylacrylamide, N,N-dimethylaminopropylmethacrylamide, N,N-dimethylaminopropylacrylamide, N-methylacrylamide, diacetonacrylamide, N,N-dimethylaminoethyl methacrylate, N,N-diethylaminoethyl methacrylate, N,N-dimethylaminoethyl acrylate and acryloylmorpholine.

The monomers to constitute urea-based polymers include, for example, methylolated urea, dimethylolated urea and ethylene-urea.

The monomers to constitute melamine-based polymers include, for example, methoxymethylated melamine, methoxymethylated isobutoxymethylated melamine and methoxyethylated melamine.

Of monomers constituting epoxy polymers and amide-based polymers, water-soluble monomers are usable herein.

In the copolymer of methacrylic acid and/or methyl methacrylate with the monomer to constitute the above-mentioned polymers, the monomer preferably accounts for 60-99 mass %, more preferably 80-99 mass % of methacrylic acid and/or methyl methacrylate.

(ii) The water-soluble polymer is a copolymer or a mixed resin of polymethacrylic acid and/or polymethyl methacrylate with at least one polymer selected from alkylene glycol-based polymers, cellulosic derivatives, vinylic polymers, acrylic polymers (excluding polymethacrylic acid and polymethyl methacrylate), urea-based polymers, epoxy polymers, amide-based polymers and melamine-based polymers.

Preferably, the alkylene glycol-based polymers, the cellulosic derivatives, the vinylic polymers, the acrylic polymers (excluding polymethacrylic acid and polymethyl methacrylate), the urea-based polymers, the epoxy polymers, the amide-based polymers and the melamine-based polymers are those comprising any of the above-mentioned constitutive monomers.

Preferably, the content of polymethacrylic acid and/or polymethyl methacrylate in the water-soluble polymer is 60-99 mass %, more preferably 80-99 mass %.

(iii) The water-soluble polymer is a copolymer of methacrylic acid and/or methyl methacrylate, acrylic acid and/or methyl acrylate, and at least one monomer selected from those constituting alkylene glycol-based polymers, cellulosic derivatives; vinylic polymers, acrylic polymers, urea-based polymers, epoxy polymers, amide-based polymers and melamine-based polymers (in which the monomers to constitute acrylic polymers do not include methacrylic acid, methyl methacrylate, acrylic acid and methyl acrylate).

Preferably, the alkylene glycol-based polymers, the cellulosic derivatives, the vinylic polymers, the acrylic polymers, the urea-based polymers, the epoxy polymers, the amide-based polymers and the melamine-based polymers (in which the monomers constituting acrylic polymers do not include methacrylic acid, methyl methacrylate, acrylic acid and methyl acrylate) are those comprising any of the above-mentioned constitutive monomers.

In the copolymer of methacrylic acid and/or methyl methacrylate with the monomer constituting the above-mentioned polymers, the monomer preferably accounts for 5-35 mass %, more preferably 10-25 mass % of methacrylic acid and/or methyl methacrylate. Also preferably, the content of acrylic acid and/or methyl acrylate in the water-soluble copolymer is 35-75 mass %, more preferably 50-70 mass %.

(iv) The water-soluble polymer is a copolymer or a mixed resin of polymethacrylic acid and/or polymethyl methacrylate, polyacrylic acid and/or polymethyl acrylate, and at least one polymer selected from alkylene glycol-based polymers, cellulosic derivatives, vinylic polymers, acrylic polymers (excluding polymethacrylic acid, polymethyl methacrylate, polyacrylic acid and polymethyl acrylate), urea-based polymers, epoxy polymers, amide-based polymers and melamine-based polymers.

Preferably, the alkylene glycol-based polymers, the cellulosic derivatives, the vinylic polymers, the acrylic polymers excluding polymethacrylic acid; polymethyl methacrylate, polyacrylic acid and polymethyl acrylate), the urea-based polymers, the epoxy polymers, the amide-based polymers and the melamine-based polymers are those comprising any of the above-mentioned constitutive monomers.

Preferably, the content of polymethacrylic acid and/or polymethyl methacrylate in the water-soluble-polymer is 5-35 mass %, more preferably 10-25 mass %. Also preferably, the content of polyacrylic acid and/or polymethyl acrylate in the water-soluble polymer is 35-75 mass %, more preferably 50-70 mass %.

Comprising the water-soluble polymer of the above-mentioned embodiments (i) to (iv), the over-coating agent for forming fine-line patterns of the invention carries the advantages that the exposure margin is large and the dimension control of photoresist patterns can be reflected on the dimension controllability of fine-line patterns, and therefore it enjoys the best effects of invention in that the dimension control and planning of fine-line patterns which is obtained after treatment for thermal, shrinkage can be attained with ease in the stage of photoresist patterning; that the original photoresist pattern profile can be kept as such and the top of the photoresist pattern is not rounded after thermal shrinkage; that the degree of thermal shrinkage of the over-coating agent relative to the temperature at which the over-coating agent is heated can be increased more than that in conventional technology; and that the intended fine-line patterns can be formed more efficiently.

In particular, the embodiments (iii) and (iv) comprising (poly)methacrylic acid (ester) and additionally (poly)acrylic acid (ester) are especially preferred as compared with the embodiments (i) and (ii), since the exposure margin can be broadened more while the degree of thermal shrinkage can be kept on the same level, and since they are more effective for smoothing the profile of the side wall of pattern lines (smoothing effect).

In the embodiments (i) to (iv), the polymer to be selected preferably comprises at lease one polymer selected from alkylene glycol-based polymers, cellulosic derivatives, vinylic polymers and acrylic polymers. One or more additional polymers may be in the copolymer. Preferred examples of the additional polymers in the invention are polyvinylpyrrolidone, polyvinylimidazole and acryloylmorpholine.

The over-coating agent for forming fine patters may additionally contain water-soluble amines. For special purposes such as preventing the generation of impurities and pH adjustment, water-soluble amines that have pKa (acid dissociation constant) values of 7.5-13 in aqueous solution at 25° C. are preferably used. Specific examples include the following: alkanolamines, such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, 1,4-butanediamine, N-ethylethylenediamine, 1,2-propanediamine, 1,3-propanediamine and 1,6-hexanediamine; aliphatic amines, such as triethylamine, 2-ethyl-hexylamine, dioctylamine, tributylamine, tripropylamine, triallylamine, heptylamine and cyclohexylamine; aromatic amines, such as benzylamine and diphenylamine; and cyclic amines, such as piperazine, N-methyl-piperazine and hydroxyethylpiperazine. Preferred ones are aliphatic amines in view of easiness of keeping shapes of patterns, as exemplified by triethylamine.

If the water-soluble amine is to be added, it is preferably incorporated in an amount of about 0.1-30 mass %, more preferably about 2-15 mass %, of the over-coating agent (in terms of solids content). If the water-soluble amine is incorporated in an amount of less than 0.1 mass %, the coating fluid may deteriorate over time. If the water-soluble amine is incorporated in an amount exceeding 30 mass %, the photoresist pattern being formed may deteriorate in shape.

For such purposes as reducing the dimensions of patterns and controlling the occurrence of defects, the over-coating agent for forming fine patterns may further optionally contain non-amine based, water-soluble organic solvents.

As such non-amine based, water-soluble organic solvents, any non-amine based organic solvents that can mix with water may be employed and they may be exemplified by the following: sulfoxides, such as dimethyl sulfoxide; sulfones, such as dimethylsulfone, diethylsulfone, bis(2-hydroxyethyl) sulfone and tetramethylenesulfone; amides, such as N,N-dimethylformamide, N-methylformamide, N,N-dimethylacetamide, N-methylacetamine and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobuthyl ether, ethylene glycol monomethyl ether acetate, ethylene glycol monoethyl ether acetate, diethylene glycol, diethylene glycol monomethyl ether, diethylene glycol monoethyl ether, diethylene glycol monobuthyl ether, propylene glycol, propylene glycol monomethyl ether, glycerol, 1,2-butylene glycol, 1,3-butylene glycol and 2,3-butylene glycol. Among those mentioned above, polyhydric alcohols and their derivatives are preferred for the purposes of reducing the dimensions of patterns and controlling the occurrence of defects and glycerol is particularly preferred. The non-amine based, water-soluble organic solvents may be used either singly or in combination.

If the non-amine based, water-soluble organic solvent is to be added, it is preferably incorporated in an amount of about 0.1-30 mass %, more preferably about 0.5-15 mass %, of the water-soluble polymer. If the non-amine based, water-soluble organic solvent is incorporated in an amount of less than 0.1 mass %, its defect reducing effect tends to decrease. Beyond 30 mass %, a mixing layer is liable to form at the interface with the photoresist pattern.

In addition, the over-coating agent may optionally contain a surfactant for attaining special effects such as coating uniformity and wafer's in-plane uniformity.

The surfactant is preferably employed that, when added to the water-soluble polymer, exhibits certain characteristics such as high solubility, non-formation of a suspension and miscibility with the polymer component. By using surfactants that satisfy these characteristics, the occurrence of defects can be effectively controlled that is considered to be pertinent to forming fine-line patters upon coating the over-coating agent.

From the points above, surfactants in the invention are preferably employed at least the one selected among N-alkylpyrrolidones, quaternary ammonium salts and phosphate esters of polyoxyethylene.

N-alkylpyrrolidones as surfactant are preferably represented by the following general formula (I):

where $R_1$ is an alkyl group having at least 6 carbon atoms.

Specific examples of N-alkylpyrrolidones as surfactant include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone and N-octadecyl-2-pyrrolidone. Among these, N-octyl-2-pyrrolidone ("SURFADONE LP 100" of ISP Inc.) is preferably used.

Quaternary ammonium salts as surfactant are preferably represented by the following general formula

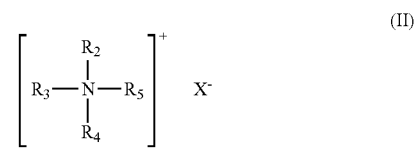

where $R_2$, $R_3$, $R_4$ and $R_5$ are each independently an alkyl group or a hydroxyalkyl group (provided that at least one of them is an alkyl or hydroxyalkyl group having not less than 6 carbon atoms); $X^-$ is a hydroxide ion or a halogenide ion.

Specific examples of quaternary ammonium salts as surfactant include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide and octadecyltrimethylammonium hydroxide. Among these, hexadecyltrimethylammonium hydroxide is preferably used.

Phosphate esters of polyoxyethylene are preferably represented by the following general formula (III):

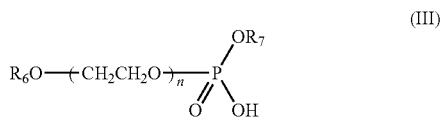

where $R_6$ is an alkyl or alkylaryl group having 1-10 carbon atoms; $R_7$ is a hydrogen atom or $(CH_2CH_2O)R_6$ (where $R_6$ is as defined above); n is an integer of 1-20.

To mention specific examples, phosphate esters of polyoxyethylene that can be used as surfactants are commercially available under trade names "PLYSURF A212E" and "PLYSURF A210G" from Dai-ichi Kogyo Seiyaku Co., Ltd.

If the surfactant is to be added, it is preferably incorporated in an amount of about 0.1-10 mass %, more preferably about 0.2-2 mass %, of the over-coating agent (in terms of solids content). By adopting the amount as described above ranges, it may effectively prevent the variations in the percent shrinkage of patterns, potentially depending on the wafer's in-plane uniformity which is caused by the deterioration of coating property, and also prevent the occurrence of defects that are considered to have cause-and-effect relations with microfoaming on the applied film that generates as the coating conditions are worsened.

The over-coating agent of the invention for forming fine patterns is preferably used as an aqueous solution at a concentration of 3-50 mass %, more preferably at 5-30 mass %. If the concentration of the aqueous solution is less than 3 mass, poor coverage of the substrate may result. If the concentration of the aqueous solution exceeds 50 mass %, there is no appreciable improvement in the intended effect that justifies the increased concentration and the solution cannot be handled efficiently.

As already mentioned, the over-coating agent of the invention for forming fine patterns is usually employed as an aqueous solution using water as the solvent. A mixed solvent system comprising water and an alcoholic solvent may also be employed. Exemplary alcoholic solvents are monohydric alcohols including methyl alcohol, ethyl alcohol, propyl alcohol and isopropyl alcohol. These alcoholic solvents are mixed with water in amounts not exceeding about 30 mass %.

The over-coating agent for forming fine patterns of the invention carries the advantages that the exposure margin is large and the dimension control of photoresist patterns can be reflected on the dimension control of forming fine-line patterns, that the photoresist pattern profile after thermal shrinkage stage can be kept rectangular and the top thereof is prevented from being rounded, and that the degree of thermal shrinkage of the over-coating agent is large relative to the temperature at which the agent is heated.

The method of forming fine-line patterns according to the second aspect of the invention comprises the steps of covering a substrate having photoresist patterns thereon with the above-described over-coating agent for forming fine patterns, then applying heat treatment to shrink the applied over-coating agent under the action of heat so that the spacing between adjacent photoresist patterns is reduced, and subsequently removing the applied film of the over-coating agent substantially completely.

The method of preparing the substrate having photoresist patterns thereon is not limited to any particular type and it can be prepared by conventional methods employed in the fabrication of semiconductor devices, liquid-crystal display devices, magnetic heads and microlens arrays. In an exemplary method, a photoresist composition of chemically amplifiable or other type is spin- or otherwise coated on a substrate such as a silicon wafer and dried to form a photoresist layer, which is illuminated with an activating radiation such as ultraviolet, deep-ultraviolet or excimer laser light through a desired mask pattern using a reduction-projection exposure system or subjected to electron beam photolithography, then heated and developed with a developer such as an alkaline aqueous solution, typically a 1-10 mass % tetramethylammonium hydroxide (TMAH) aqueous solution, thereby forming a photoresist pattern on the substrate.

The photoresist composition serving as a material from which photoresist patterns are formed is not limited in any particular way and any common photoresist compositions may be employed including those for exposure to i- or g-lines, those for exposure with an excimer laser (e.g. KrF, ArF or $F_2$) and those for exposure to EB (electron beams). According to the invention, even in a photoresist having a low thermal flow temperature of around 150° C. or lower, the top of the photoresist pattern can be prevented from being rounded, and while the degree of thermal shrinkage of the over-coating agent is kept as such, the exposure margin may be broadened. Still another advantage of the invention is that the controllability in patterning is good.

[a.] Over-Coating Agent Application Step

After thusly forming the photoresist pattern as a mask pattern, the over-coating agent for forming fine patterns is applied to cover entirely the substrate. After applying the over-coating agent, the substrate may optionally be pre-baked at a temperature of 80-100° C. for 30-90 seconds.

The over-coating agent may be applied by any methods commonly employed in the conventional heat flow process. Specifically, an aqueous solution of the over-coating agent for forming fine patterns is applied to the substrate by any known application methods including bar coating, roll coating and whirl coating with a spinner.

[b.] Heat Treatment (Thermal Shrinkage) Step

In the next step, heat treatment is performed to cause thermal shrinkage of the film of the over-coating agent. Under the resulting force of thermal shrinkage of the film, the dimensions of the photoresist pattern in contact with the film will increase by an amount equivalent to the thermal shrinkage of the film and, as the result, the photoresist pattern widens and accordingly the spacing between adjacent photoresist patterns lessens. The spacing between adjacent photoresist patterns determines the diameter or width of the pattern elements to be finally obtained, so the decrease in the spacing between adjacent photoresist patterns contributes to reducing the diameter of each element of a hole pattern or the width of each element of a trench pattern, eventually leading to the definition of a pattern with smaller feature sizes.

The heating temperature is not limited to any particular value as long as it is high enough to cause thermal shrinkage of the film of the over-coating agent and form or define a fine pattern. Heating is preferably done at a temperature that will not cause thermal fluidizing of the photoresist pattern. The temperature that will not cause thermal fluidizing of the photoresist pattern is such a temperature that when a substrate on which the photoresist pattern has been formed but no film of the over-coating agent has been formed is heated, the photoresist pattern will not experience any dimensional changes. Performing a heat treatment under such temperature conditions is very effective for various reasons, e.g. a fine-line pattern of good profile can be formed more efficiently and the duty ratio in the plane of a wafer, or the dependency on the spacing between photoresist patterns in the plane of a wafer, can be reduced. Considering the softening points of a variety of photoresist compositions employed in current photolithographic techniques, the preferred heat treatment is usually performed within a temperature range of about 80-160° C. for 30-90 seconds, provided that the temperature is not high enough to cause thermal fluidizing of the photoresist.

[c.] Over-Coating Agent Removal Step

In the subsequent step, the remaining film of the over-coating agent on the patterns is removed by washing with an aqueous solvent, preferably pure water, for 10-60 seconds. Prior to washing with water, rinsing may optionally be performed with an aqueous solution of alkali (e.g. tetramethylammonium hydroxide (TMAH) or choline). The over-coating-agent of the present invention is easy to remove by washing with water and it can be completely removed from the substrate and the photoresist pattern.

As a result, each pattern on the substrate has a smaller feature size because each pattern is defined by the narrowed spacing between the adjacent widened photoresist patterns.

The fine-line pattern thus formed using the over-coating agent of the present invention has a pattern size smaller than the resolution limit attainable by the conventional methods. In addition, it has a good enough profile and physical properties that can fully satisfy the characteristics required of semiconductor devices.

Steps [a.]-[c.] may be repeated several times. By repeating steps [a.]-[c.] several times, the photoresist trace patterns (mask patterns) can be progressively widened.

The technical field of the present invention is not limited to the semiconductor industry and it can be employed in a wide range of applications including the fabrication of liquid-crystal display devices, the production of magnetic heads and even the manufacture of microlens arrays.

EXAMPLES

The following examples are provided for further illustrating the present invention but are in no way to be taken as limiting. Unless otherwise noted, all amounts of ingredients are expressed in mass %.

Example 1

A copolymer of methacrylic acid and vinylpyrrolidone (2 g; polymerization ratio=9:1), triethylamine (0.12 g) and a polyoxyethyelene phosphate ester surfactant (0.02 g; "PLYSURF A210G", product of Dai-ichi Kogyo Seiyaku Co, Ltd.) were dissolved in water (27 g) to prepare an over-coating agent.

A substrate was whirl coated with a positive-acting photoresist TARF-P7052 (product of Tokyo Ohka Kogyo Co., Ltd.) and baked at 150° C. for 90 seconds to form a photoresist layer in a thickness of 0.34 □m.

The photoresist layer was exposed with an exposure unit (NSR-S302, product of Nikon Corp.), subjected to heat treatment at 100° C. for 90 seconds and developed with an aqueous solution of 2.38 mass % TMAH (tetramethylammonium hydroxide) to form photoresist patterns which defined hole patterns with an each diameter of 140.2 nm (i.e., the spacing between the photoresist patterns, or the initial hole dimension, was 140.2 nm).

The previously prepared over-coating agent was applied onto the substrate including hole patterns and subjected to heat treatment at 155° C. for 60 seconds, thereby reducing the each size of the hole patterns. Subsequently, the substrate was brought into contact with pure water at 23° C. to remove the over-coating agent. The each diameter of the hole patterns was reduced to 120.5 nm. The photoresist pattern profile was kept rectangular and its top was prevented from being rounded.

Example 2

A copolymer of methacrylic acid and vinylpyrrolidone (1 g; polymerization ratio=9:1), a copolymer of acrylic acid and vinylpyrrolidone (1 g; polymerization ratio=2:1), triethylamine (0.12 g) and a polyoxyethyelene phosphate ester surfactant (0.02 g; "PLYSURF A210G", product of Dai-ichi Kogyo Seiyaku Co, Ltd.) were dissolved in water (27 g) to prepare an over-coating agent.

A substrate was whirl coated with a positive-acting photoresist TARF-P7052 (product of Tokyo Ohka Kogyo Co., Ltd.) and baked at 115° C. for 90 seconds to form a photoresist layer in a thickness of 0.34 □m.

The photoresist layer was exposed with an exposure unit (NSR-S302, product of Nikon Corp.), subjected to heat treatment at 100° C. for 90 seconds and developed with an aqueous solution of 2.38 mass % TMAH (tetramethylammonium hydroxide) to form photoresist patterns which defined hole patterns with an each diameter of 140.2 nm (i.e., the spacing between the photoresist patterns, or the initial hole dimension, was 140.2 nm).

The previously prepared over-coating agent was applied onto the substrate including hole patterns and subjected to heat treatment at 155° C. for 60 seconds, thereby reducing the each size of the hole patterns. Subsequently, the substrate was brought into contact with pure water at 23° C. to remove the over-coating agent. The each diameter of the hole patterns was reduced to 119.7 nm. The photoresist pattern profile was kept rectangular and its top was prevented from being rounded.

Example 3

A copolymer of methacrylic acid, acrylic acid and vinylpyrrolidone (2 g; polymerization ratio=17:60:23), triethylamine (0.12 g) and a polyoxyethyelene phosphate ester surfactant (0.02 g; "PLYSURF A210G", product of Dai-ichi Kogyo Seiyaku Co, Ltd.) were dissolved in water (27 g) to prepare an over-coating agent.

A substrate was whirl coated with a positive-acting photoresist TARF-P7052 (product of Tokyo Ohka Kogyo Co., Ltd.) and baked at 115° C. for 90 seconds to form a photoresist layer in a thickness of 0.34 □m.

The photoresist layer was exposed with an exposure unit (NSR-S302, product of Nikon Corp.), subjected to heat treatment at 10.0° C. for 90 seconds and developed with an aqueous solution of 2.38 mass % TMAH (tetramethylammonium hydroxide) to form photoresist patterns which defined hole patterns with an each diameter of 140.2 nm (i.e., the spacing between the photoresist patterns, or the initial hole dimension, was 140.2 nm).

The previously prepared over-coating agent was applied onto the substrate including hole patterns and subjected to heat treatment at 155° C. for 60 seconds, thereby reducing the each size of the hole patterns. Subsequently, the substrate was brought into contact with pure water at 23° C. to remove the over-coating agent. The each diameter of the hole patterns was reduced to 119.5 nm. The photoresist pattern profile was kept rectangular and its top was prevented from being rounded.

Comparative Example 1

A copolymer of acrylic acid and vinylpyrrolidone (2 g; polymerization ratio=2:1), triethylamine (0.12 g) and a polyoxyethyelene phosphate ester surfactant (0.02 g; "PLYSURF A210G", product of Dai-ichi Kogyo Seiyaku Co, Ltd.) were dissolved in water (27 g) to prepare an over-coating agent.

The thusly prepared over-coating agent was then applied onto the substrate including hole patterns that were formed in the same manner as described in Example 1 (the initial hole dimension, was 140.2 nm), and subjected to heat treatment at 155° C. for 60 seconds, thereby reducing the each size of the hole patterns. Subsequently, the substrate was brought into contact with pure water at 23° C. to remove the over-coating agent. The each diameter of the hole patterns was reduced to 119.9 nm, however the top of the photoresist pattern was rounded.

As described in detail hereinabove, the over-coating agent for forming fine patterns of the invention carries the advantages that the exposure margin is large and the dimension control of photoresist patterns can be reflected on the dimension control of forming fine-line patterns, that the photoresist pattern profile after thermal shrinkage stage can be kept rectangular and the top thereof is prevented from being rounded, and that the degree of thermal shrinkage of the over-coating agent is large relative to the temperature at which the agent is heated.

What is claimed is:

1. A method of forming fine patterns comprising the steps of:
   covering a substrate having photoresist patterns thereon with an over-coating agent for forming fine patterns comprising a water-soluble polymer containing at least methacrylic acid and/or methyl methacrylate as the constitutive monomer thereof to form a film,
   then applying a heat treatment to shrink the applied over-coating agent film under the action of heat so that the spacing between adjacent photoresist patterns is lessened, and
   subsequently removing the applied over-coating agent film substantially completely.

2. The method according to claim 1, wherein the over-coating agent for forming fine patterns further comprises an aliphatic amine.

3. The method according to claim 2, wherein the aliphatic amine is triethylamine.

4. The method according to claim 1, wherein the water-soluble polymer is a copolymer of methacrylic acid and/or methyl methacrylate with at least one monomer selected from those constituting alkylene glycol-based polymers, cellulosic derivatives, vinylic polymers, acrylic polymers, urea-based polymers, epoxy polymers, amide-based polymers and melamine-based polymers (in which the monomers to constitute acrylic polymers do not include methacrylic acid and methyl methacrylate).

5. The method according to claim 4, wherein the water-soluble polymer contains methacrylic acid and/or methyl methacrylate in a ratio of 60-99 mass % of the polymer.

6. The method according to claim 1, wherein the water-soluble polymer is a copolymer or a mixed resin of polymethacrylic acid and/or polymethyl methacrylate with at least one polymer selected from the group consisting of alkylene glycol-based polymers, cellulosic derivatives, vinylic polymers, acrylic polymers (excluding polymethacrylic acid and polymethyl methacrylate), urea-based polymers, epoxy polymers, amide-based polymers and melamine-based polymers.

7. The method according to claim 6, wherein the water-soluble polymer contains polymethacrylic acid and/or polymethyl methacrylate in a ratio of 60-99 mass % of the polymer.

8. The method according to claim 1, wherein the water-soluble polymer is a copolymer of methacrylic acid and/or methyl methacrylate, acrylic acid and/or methyl acrylate, and at least one monomer selected from polymers constituting alkylene glycol-based polymers, cellulosic derivatives, vinylic polymers, acrylic polymers, urea-based polymers, epoxy polymers, amide-based polymers and melamine-based polymers (in which the monomers to constitute acrylic polymers do not include methacrylic acid, methyl methacrylate, acrylic acid and methyl acrylate).

9. The method according to claim 8, wherein the water-soluble polymer contains methacrylic acid and/or methyl methacrylate in a ratio of 5-35 mass % of the polymer, and acrylic acid and/or methyl acrylate in a ratio of 35-75 mass % of the polymer.

10. The method according to claim 1, wherein the water-soluble polymer is a copolymer or a mixed resin of polymethacrylic acid and/or polymethyl methacrylate, polyacrylic acid and/or polymethyl acrylate, and at least one polymer selected from the group consisting of alkylene glycol-based polymers, cellulosic derivatives, vinylic polymers, acrylic polymers (not including polymethacrylic acid, polymethyl methacrylate, polyacrylic acid and polymethyl acrylate), urea-based polymers, epoxy polymers, amide-based polymers and melamine-based polymers.

11. The method according to claim 10, wherein the water-soluble polymer contains polymethacrylic acid and/or polymethyl methacrylate in a ratio of 5-35 mass % of the polymer, and polyacrylic acid and/or polymethyl acrylate in a ratio of 35-75 mass % of the polymer.

12. The method according to claim 1, wherein the over-coating agent for forming fine patterns is an aqueous solution having a concentration of 3-50 mass %.

13. The method of forming fine patterns according to claim 1, wherein the heat treatment is performed by heating the substrate at a temperature that does not cause thermal fluidizing of the photoresist patterns on the substrate.

* * * * *